(12) United States Patent
Katsuki et al.

(10) Patent No.: US 10,837,398 B2
(45) Date of Patent: Nov. 17, 2020

(54) WAVEFORM ANALYTICS FOR OPTIMIZING PERFORMANCE OF A MACHINE

(71) Applicant: INTERNATIONAL BUSINESS MACHINES CORPORATION, Armonk, NY (US)

(72) Inventors: Takayuki Katsuki, Tokyo (JP); Rudy Raymond Harry Putra, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/408,732

(22) Filed: May 10, 2019

(65) Prior Publication Data

US 2019/0264632 A1 Aug. 29, 2019

Related U.S. Application Data

(63) Continuation of application No. 14/984,725, filed on Dec. 30, 2015, now Pat. No. 10,385,799.

(51) Int. Cl.
*F02D 45/00* (2006.01)
*F02P 5/00* (2006.01)
(Continued)

(52) U.S. Cl.
CPC ............ *F02D 45/00* (2013.01); *F02P 5/00* (2013.01); *G01M 15/04* (2013.01);
(Continued)

(58) Field of Classification Search
CPC ..... F02D 45/00; G01R 19/2509; G01R 23/16; F02P 5/00; G01M 15/048
See application file for complete search history.

(56) References Cited

U.S. PATENT DOCUMENTS 8,122,868 B2 2/2012 Zavala Jurado et al.
8,813,690 B2 8/2014 Kumar et al.
(Continued)

FOREIGN PATENT DOCUMENTS

EP 2375034 A2 12/2011
JP H4-086532 A 3/1992
(Continued)

OTHER PUBLICATIONS

List of IBM Patents or Patent Applications Treated as Related dated May 10, 2019, 2 pages.
(Continued)

*Primary Examiner* — Ajay Ojha
(74) *Attorney, Agent, or Firm* — Tutunjian & Bitetto, P.C.; Vazken Alexanian

(57) ABSTRACT

An apparatus obtains waveforms representing measurements of a physical characteristic of a machine's operation and performance results of the machine corresponding respectively to the waveforms, each of the performance results being indicative of the machine's performance under conditions at which the measurement represented by the corresponding waveform was made. The apparatus calculates, for each of at least interval associated with each of the waveforms, an influence value that represents a degree of influence of the waveforms on the performance results over the interval.

20 Claims, 10 Drawing Sheets

(51) Int. Cl.
*G01M 15/04* (2006.01)
*G01R 19/25* (2006.01)
*G01R 23/16* (2006.01)

(52) U.S. Cl.
CPC ....... *G01M 15/048* (2013.01); *G01R 19/2509* (2013.01); *G01R 23/16* (2013.01)

(56) References Cited

U.S. PATENT DOCUMENTS

2004/0187847 A1* 9/2004 Viele ................. F02D 35/021
　　　　　　　　　　　　　　　　　　　　　123/406.27
2008/0262705 A1* 10/2008 Oe ................... F02D 35/027
　　　　　　　　　　　　　　　　　　　　　701/111
2017/0089283 A1* 3/2017 Ogawa ............. F02D 41/1447

FOREIGN PATENT DOCUMENTS

| | | |
|---|---|---|
| JP | H11-142313 A | 5/1999 |
| JP | 2005-291081 A | 10/2005 |
| JP | 2006-292734 A | 10/2006 |
| JP | 2007-155525 A | 6/2007 |
| JP | 2008-111423 A | 5/2008 |
| JP | 2009-216386 A | 9/2009 |
| JP | 2010-127163 A | 6/2010 |
| JP | 2017-061884 A | 3/2017 |
| WO | 2012/035647 A1 | 3/2012 |
| WO | 2010110021 A | 9/2012 |

OTHER PUBLICATIONS

IBM letter citing references from Japanese Office Action issued in JP2017-120258, dated Aug. 20, 2020, pp. 1-2.

\* cited by examiner

| Waveform | Performance Result |
|---|---|
| $f^{j=1}$ | $y_{out}^{j=1}$ |
| $f^2$ | $y_{out}^2$ |
| $f^3$ | $y_{out}^3$ |
| $f^4$ | $y_{out}^4$ |
| ⋮ | ⋮ |
| $f^m$ | $y_{out}^m$ |

WAVEFORM ANALYTICS FOR OPTIMIZING PERFORMANCE OF A MACHINE

BACKGROUND

Technical Field

The present invention relates to waveform analytics for optimizing performance of a machine.

Related Art

The performance of a machine, such as a combustion engine, has various aspects, such as fuel efficiency, emission gas, noise, etc., which are affected by various factors. For example, it is known that the rate of heat release in the engine cylinders is one of the factors contributing to the performance of a combustion engine. In principle, on the basis of such knowledge, waveforms representing measurements of the rate of heat release or another such factor can be analyzed to determine correlations between features of the waveforms and associated performance results, such as engine noise. However, as a practical matter, producing accurate correlations and predictions is difficult, especially given a large set of data.

SUMMARY

Therefore, it is an object of an aspect of the innovations herein to provide an apparatus capable of overcoming the above drawbacks accompanying the related art. The above and other objects can be achieved by the combinations recited in the claims. A first aspect of the innovations herein may include an apparatus including a data input section operable to obtain a plurality of waveforms representing measurements of a physical characteristic of a machine's operation and a plurality of performance results of the machine corresponding respectively to the plurality of waveforms, each of the performance results indicative of the machine's performance under conditions at which the measurement represented by the corresponding waveform was made, a dividing section operable to divide each of the waveforms into a common plurality of intervals, and a calculating section operable to calculate, for each of at least one of the intervals, an influence value that represents a degree of influence of the plurality of waveforms on the plurality of performance results over the interval.

A second aspect of the innovations herein may include a method including obtaining a plurality of waveforms representing measurements of a physical characteristic of a machine's operation and a plurality of performance results of the machine corresponding respectively to the plurality of waveforms, each of the performance results indicative of the machine's performance under conditions at which the measurement represented by the corresponding waveform was made, dividing each of the waveforms into a common plurality of intervals, and calculating, for each of at least one of the intervals, an influence value that represents a degree of influence of the plurality of waveforms on the plurality of performance results over the interval.

A third aspect of the innovations herein may include a computer program product including a non-transitory computer readable storage medium having program instructions stored therein, the program instructions executable by a computer to cause the computer to perform operations including obtaining a plurality of waveforms representing measurements of a physical characteristic of a machine's operation and a plurality of performance results of the machine corresponding respectively to the plurality of waveforms, each of the performance results indicative of the machine's performance under conditions at which the measurement represented by the corresponding waveform was made, dividing each of the waveforms into a common plurality of intervals, and calculating, for each of at least one of the intervals, an influence value that represents a degree of influence of the plurality of waveforms on the plurality of performance results over the interval.

A fourth aspect of the innovations herein may include an apparatus to permit improved performance of a machine based on one or more outputs generated during operation of the machine. The apparatus includes a data input section operable to obtain a plurality of waveforms from a machine representing measurements of a physical characteristic of the machine's operation, and a plurality of performance results of the machine corresponding respectively to the plurality of waveforms, each of the plurality of performance results being indicative of the machine's performance under conditions at which the measurement represented by the corresponding waveform was made, and a calculating section operable to calculate, for each of at least one of a plurality of intervals associated with each of the plurality of waveforms, an influence value that represents a degree of influence of the plurality of waveforms on the plurality of performance results over the interval to permit the improved performance of the machine during operation of the machine.

A fifth aspect of the innovations herein may include a method for permitting improved performance of a machine based on one or more outputs generated during operation of the machine. The method includes obtaining a plurality of waveforms from a machine representing measurements of a physical characteristic of a machine's operation, and a plurality of performance results of the machine corresponding respectively to the plurality of waveforms, each of the plurality of performance results indicative of the machine's performance under conditions at which the measurement represented by the corresponding waveform was made, and calculating, for each of at least one of a plurality of intervals associated with each of the plurality of waveforms, an influence value that represents a degree of influence of the plurality of waveforms on the plurality of performance results over the interval to permit the improved performance of the machine during operation of the machine.

A sixth aspect of the innovations herein may include a computer program product including a non-transitory computer readable storage medium having program instructions stored therein, the program instructions executable by a computer to cause the computer to perform operations for permitting improved performance of a machine based on one or more outputs generated during operation of the machine. The operations include obtaining a plurality of waveforms from a machine representing measurements of a physical characteristic of a machine's operation, and a plurality of performance results of the machine corresponding respectively to the plurality of waveforms, each of the plurality of performance results indicative of the machine's performance under conditions at which the measurement represented by the corresponding waveform was made, and calculating, for each of at least one of a plurality of intervals associated with each of the plurality of waveforms, an influence value that represents a degree of influence of the plurality of waveforms on the plurality of performance results over the interval to permit the improved performance of the machine during operation of the machine.

The summary clause does not necessarily describe all of the features of the embodiments of the present invention. The present invention may also be a sub-combination of the features described above. The above and other features and advantages of the present invention will become more apparent from the following description of the embodiments, taken in conjunction with the accompanying drawings.

BRIEF DESCRIPTION OF THE DRAWINGS

FIG. 3 shows example contents of the learning data storage 101.

DETAILED DESCRIPTION

Hereinafter, example embodiments of the present invention will be described. The embodiments should not be construed as limiting the scope of the invention, which is defined by the claims. The combinations of features described in the embodiments are not necessarily essential to the invention.

Figure 1:
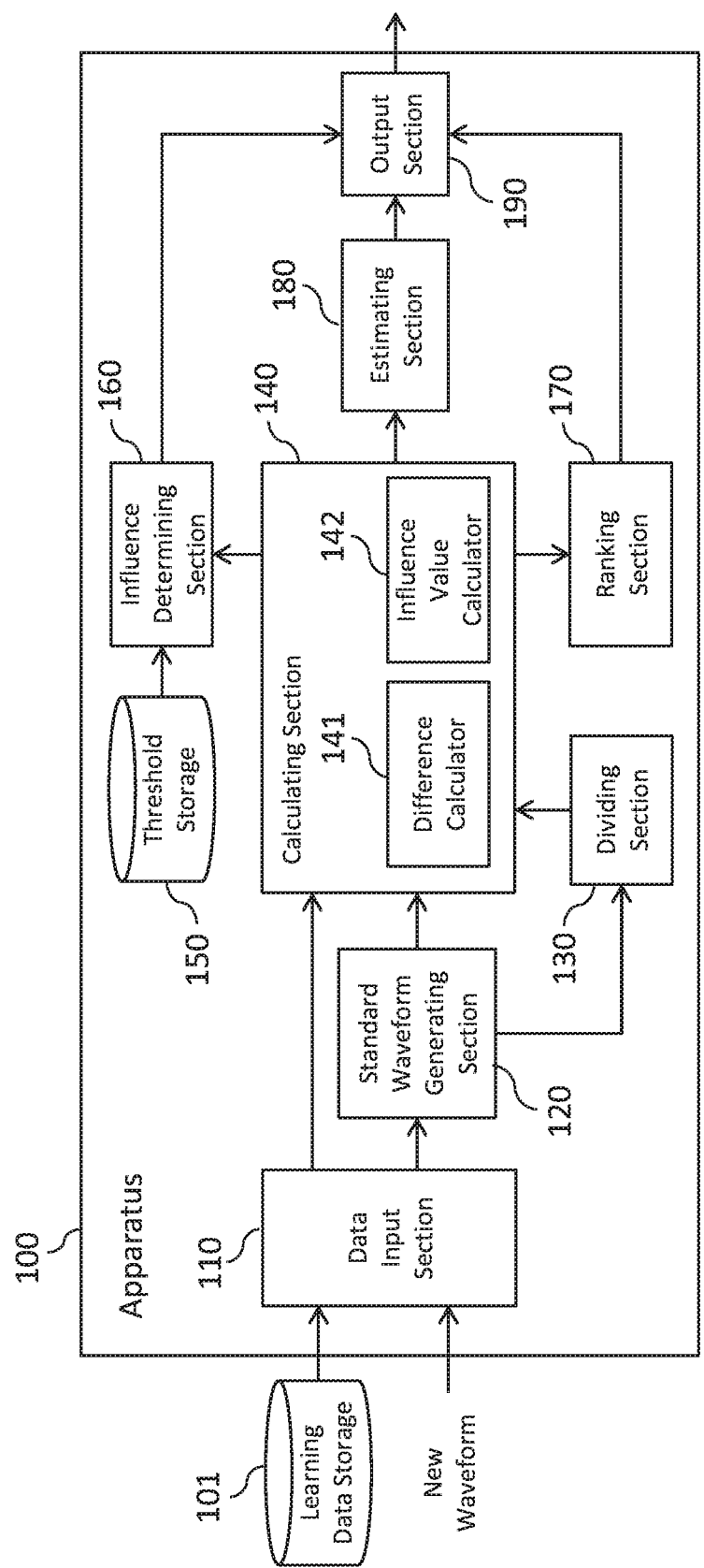
FIG. 1 shows an apparatus 100 according to an embodiment of the present invention.

FIG. 1 shows an apparatus 100 according to an embodiment of the present invention. The apparatus 100 receives learning data representative of the contribution of one or more factors to the performance of a machine. The learning data is in the form of a plurality of waveforms representing measurements of a physical characteristic of the machine's operation and a plurality of performance results of the machine corresponding respectively to the plurality of waveforms. For example, in the case where the machine is a combustion engine, the waveforms may represent measurements of the heat release rate of the engine during different engine cycles, and the performance results may represent engine noise. Based on the learning data, the apparatus 100 determines the effects that isolated features of the waveforms have on the performance results. The output of the apparatus 100 can take the form of, for example, one or more values representing degrees of influence of isolated features of the waveforms, a ranking of such values, or a prediction of performance results corresponding to a new waveform representing a hypothetical measurement of the physical characteristic of the machine's operation. On the basis of such output, machines having better performance can be designed.

The apparatus 100 includes a data input section 110, a standard waveform generating section 120, a dividing section 130, a calculating section 140, a threshold storage 150, an influence determining section 160, a ranking section 170, an estimating section 180, and an output section 190.

The data input section 110 obtains, from an external learning data storage 101, learning data including a plurality of waveforms representing measurements of a physical characteristic of a machine's operation and a plurality of performance results of the machine corresponding respectively to the plurality of waveforms. The performance results correspond to the waveforms in the sense that each of the performance results is indicative of the machine's performance under conditions at which the measurement represented by the corresponding waveform was made. For example, in the case where the waveforms represent measurements of the heat release rate of a combustion engine during different engine cycles and the performance results represent engine noise at a particular frequency or frequencies, a corresponding set of performance result and waveform represents the engine noise during the same engine cycle that the heat release rate was measured. In some cases, a waveform of the learning data may correspond to multiple performance results. For example, if a plurality of frequencies are of interest in the above example, a waveform representing heat release rate may correspond to multiple performance results representing engine noise at different frequencies. Thus, the learning data including the heat release rate waveforms and corresponding engine noise contains information about the contribution of heat release rate as a factor in engine noise at the particular frequency or frequencies.

The data input section 110 may further obtain, from a user of the apparatus 100, a new waveform representing a hypothetical measurement of the physical characteristic of the machine's operation, e.g. a hypothetical heat release rate waveform. For example, on the basis of the output, by the apparatus 100, of one or more values representing degrees of influence of isolated features of the waveforms or a ranking of such values, a user may wish to run a simulation of the machine using a hypothetical waveform. The hypothetical waveform may be a waveform of the learning data that has been slightly tweaked or otherwise altered by the user or a waveform that has been created from scratch by the user.

The learning data storage 101 stores learning data including the plurality of waveforms and the plurality of performance results corresponding respectively to the plurality of waveforms as described above. The example of heat release rate and engine noise of a combustion engine is discussed throughout this description, but the content of the learning data is not limited to this. Instead of or in addition to heat release rate of a combustion engine, the waveforms may represent measurements of any physical characteristic of any machine's operation, such as in-cylinder pressure, fuel delivery pressure, needle lift, or gas temperature of a combustion engine or other fluid pressures or temperatures measurable in other machines. Similarly, instead of or in addition to engine noise of a combustion engine, the performance results may indicate any aspect of any machine's performance, such as power consumption, fuel efficiency, or emissions.

The standard waveform generating section 120 generates a standard waveform based on the plurality of waveforms obtained by the data input section 110. The standard waveform is a waveform that resembles each of the waveforms of the plurality of waveforms or is representative of the plurality of waveforms. The standard waveform may serve as a basis for analyzing each of the plurality of waveforms. The standard waveform generating section 120 may generate the standard waveform by averaging the plurality of waveforms. Alternatively, the standard waveform generating section 120 may generate the standard waveform by selecting, as the standard waveform, the waveform whose difference with respect to the other waveforms is smallest among the plurality of waveforms.

The dividing section 130 divides each of the waveforms obtained by the data input section 110 into a common plurality of intervals. The dividing section 130 divides the standard waveform generated by the standard waveform generating section 120 into the same plurality of intervals. In the case where the waveforms represent measurements of the heat release rate of a combustion engine during different engine cycles, the waveforms may be of the form heat release rate vs. time or heat release rate vs. crank angle of a crankshaft of the engine. Thus, in such case, the intervals may be time intervals or crank angle intervals. The intervals may be irregular in the sense that the width of the intervals may vary from interval to interval. For example, the dividing section 130 may approximate the standard waveform generated by the standard waveform generating section 120 with a plurality of line segments and divide the standard waveform and each of the waveforms obtained by the data input section 110 using, as the plurality of intervals, intervals between endpoints of the line segments.

The calculating section 140 calculates, for each of at least one of the intervals, an influence value that represents a degree of influence of the plurality of waveforms on the plurality of performance results over the interval. As noted above, the dividing section 130 divides each of the waveforms into a common plurality of intervals. That is, each of the waveforms has the same set of intervals. For example, in the case where the waveforms are of the form heat release rate vs. time and the intervals are time intervals, the calculating section 140 can analyze the effect of every waveform on its corresponding performance result over a given time interval and calculate an influence value representative of all the waveforms for that time interval. The calculating section 140 includes a difference calculator 141 and an influence value calculator 142.

The difference calculator 141 calculates, for each of the interval(s) for which an influence value is to be calculated, a difference between each of the waveforms and the standard waveform over the interval. The difference calculator 141 may calculate, as the difference between a waveform and the standard waveform over the interval, the area between the waveform and the standard waveform over the interval. Alternatively, the difference calculator 141 may calculate, as the difference between a waveform and the standard waveform over the interval, the difference between the slope of the waveform and the slope of the standard waveform at the beginning or end of the interval.

The influence value calculator 142 calculates the influence value for each of the interval(s) from the differences calculated for the interval and the corresponding performance results. For example, in the case where the waveforms are of the form heat release rate vs. time, the intervals are time intervals, and the performance results represent the engine noise corresponding to each waveform, an influence value for a given time interval can be calculated based on (i) the differences between each of the waveforms and the standard waveform over that time interval and (ii) the engine noise corresponding to each of the waveforms. The resulting influence value represents the degree of influence of heat release rate on engine noise over that time interval. That is, the calculated differences may serve as representations of how exceptional each waveform is over the interval in question. If exceptional waveforms and unexceptional waveforms have the same or similar effect on the engine noise, it can be understood that the heat release rate is not so influential over the interval in question. On the other hand, if exceptional waveforms have a drastic effect on the engine noise as compared to unexceptional waveforms, it can be understood that the heat release rate is very influential over the interval in question.

The threshold storage 150 stores a threshold. The threshold may be a value representing a reference or threshold degree of influence. The threshold may be set in the threshold storage 150 by a user of the apparatus 100.

The influence determining section 160 determines whether the influence value calculated for each of the interval(s) represents a degree of influence higher than the threshold stored in the threshold storage 150. The influence determining section 160 may compare each of the influence value(s) directly to the threshold or may compare a value derived from each of the influence value(s) to the threshold.

As noted above, the calculating section 140 calculates the influence value for each of at least one of the intervals. In a case where the calculating section 140 calculates the influence value for each of at least two of the intervals, e.g. for all of the intervals, the influence values can be ranked. The ranking section 170 ranks the intervals by the absolute values of the influence values calculated for the intervals. An influence value and its negative may represent the same degree of influence. Therefore, ranking the intervals by the absolute values of the influence values provides information about the relative relevance of each interval.

The estimating section 180 estimates, using the influence value calculated by the calculating section 140 for each of the interval(s), an unknown performance result corresponding to a new waveform representing a hypothetical measurement of the physical characteristic of the machine's operation. The unknown performance result is assumed to be indicative of the machine's performance under conditions at which the hypothetical measurement represented by the new waveform would be made. For example, in the case where the waveforms of the learning data represent actual measurements of heat release rate vs. time for a combustion engine and the performance results represent the engine noise corresponding to each waveform, the new waveform may represent a hypothetical measurement of heat release rate vs. time and the unknown performance result estimated by the estimating section 180 is assumed to be indicative of the engine noise under conditions at which the hypothetical measurement represented by the new waveform would be made.

The output section 190 outputs one or more of the various outputs of the apparatus 100 for use by a downstream device or user. For example, the outputs may be stored, uploaded to a server, printed, or otherwise made available for viewing or analysis. The various outputs of the apparatus 100 include, for example, the standard waveform, one or more of the intervals, the influence values calculated for the interval(s) by the calculating section 140, one or more of the interval(s) for which the calculated influence value represents a degree of influence higher than a threshold as determined by the influence determining section 160, a set of two or more of the intervals ranked by the ranking section 170, an unknown performance result corresponding to a new waveform as estimated by the estimating section 180, etc. Such outputs can assist a user of the apparatus 100 in designing machines having better performance, e.g. reduced engine noise at a frequency of interest.

In the example of the apparatus 100 shown in FIG. 1, the dividing section 130 does not refer directly to the output of the data input section 110 but instead refers to the output of the standard waveform generating section 120, whose output may include the plurality of waveforms obtained by the data input section 110. However, in a case where the standard waveform is not used by the dividing section 130 to determine the intervals or in a case where the intervals are not irregular, the dividing section 130 may instead refer directly to the output of the data input section 110 for the plurality of waveforms without referring to the output of the standard waveform generating section 120.

In the example of the apparatus 100 shown in FIG. 1, the standard waveform generating section 120 does not refer to the output of the dividing section 130 because the waveform generating section 120 generates a standard waveform first and the dividing section 130 then divides the standard waveform and the waveforms obtained by the data input section 110 into a common plurality of intervals. However, the standard waveform generating section 120 may refer to the output of the dividing section 130 to obtain the common plurality of intervals and generate a standard waveform based on the plurality of intervals. For example, the standard waveform generating section 120 may select, for each of the intervals, the waveform whose difference with respect to the other waveforms is smallest over the interval among the plurality of waveforms and generate the standard waveform by combining the selected waveforms.

Figure 2:
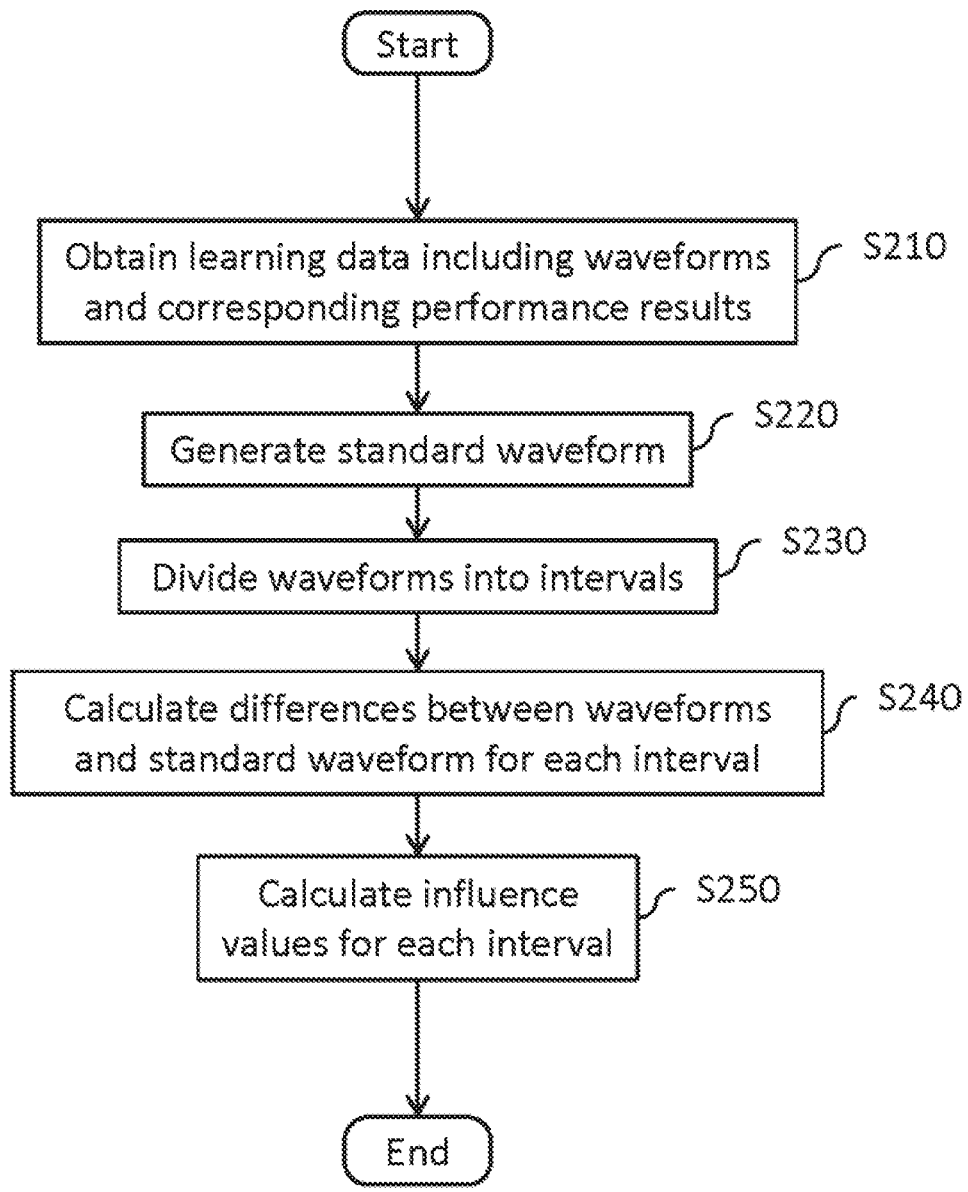
FIG. 2 shows an example operational flow of the apparatus 100 according to an embodiment of the present invention.

FIG. 2 shows an example operational flow of the apparatus 100 according to an embodiment of the present invention. In the example shown in FIG. 2, the apparatus 100 performs the operations from S210 to S250, but the apparatus 100 shown in FIG. 1 is not limited to using this operational flow. Also, the operational flow in FIG. 2 may be performed by a modified apparatus or a different apparatus that differs from the apparatus 100 shown in FIG. 1.

First, the apparatus 100 obtains learning data including a plurality of waveforms and a plurality of performance results (S210). For example, the data input section 110 of the apparatus 100 may obtain a plurality of m waveforms $f^{j=1}$, $f^2$, $f^3$, $f^4$, ... $f^m$ and a corresponding plurality of m performance results $y_{out}^{j=1}$, $y_{out}^2$, $y_{out}^3$, $y_{out}^4$, ... $y_{out}^m$ from the learning data storage 101, where the superscript j is an index for the waveform and corresponding performance result such that a set of $f^j$ and $y_{out}^j$ may be referred to as the j-th sample, and m is an integer greater than 2, e.g. around 1000 for a small dataset and more than 5,000,000 for a large data set. In the case where the waveforms of the learning data represent actual measurements of heat release rate vs. time or heat release rate vs. crank angle, the waveforms f may be of the form f (t), where t is time or crank angle. The performance results $y_{out}$ may be engine noise (e.g. dB) at a particular frequency selected for the set of learning data.

Next, the apparatus 100 generates a standard waveform based on the plurality of waveforms (S220) and divides each of the plurality of waveforms into a common plurality of intervals (S230). For example, the standard waveform generating section 120 of the apparatus 100 may generate a standard waveform $\hat{f}$ based on the plurality of waveforms f obtained by the data input section 110, and the dividing section 130 of the apparatus 100 may divide each of the waveforms f obtained by the data input section 110 and the standard waveform $\hat{f}$ generated by the standard waveform generating section 120 into a common plurality of intervals. For example, in the case where the waveforms f are of the form f (t), where t is time or crank angle, the dividing section may divide each of the waveforms f and the standard waveform $\hat{f}$ into n intervals $\Delta t_{i=1}$, $\Delta t_2$, $\Delta t_3$, $\Delta t_4$, $\Delta t_5$, $\Delta t_6$, ... $\Delta t_n$, where n is an integer greater than 1 and less than m. The order of steps S220 and S230 is not critical except that step S220 precedes step S230 in the case that the dividing section 130 use the standard waveform to determine the plurality of intervals, for example, by using, as the plurality of intervals, intervals between endpoints of line segments that approximate the standard waveform. If, on the other hand, the dividing section 130 does not refer to the standard waveform, e.g. if regular intervals independent of the standard waveform are used, steps S220 and S230 can be performed in any order or simultaneously.

Next, the apparatus 100 calculates a difference between each of the waveforms and the standard waveform for each interval (S240). For example, the difference calculator 141 of the calculating section 140 of the apparatus 100 may calculate the difference between each of the plurality of waveforms f obtained by the data input section 110 and the standard waveform $\hat{f}$ generated by the standard waveform generating section 120 for all or a subset of the intervals $\Delta t$ used by the dividing section 130.

Lastly, the apparatus calculates an influence value for each of the interval(s) from the differences calculated for the interval and the performance results (S250). For example, the influence value calculator 142 of the calculating section 140 of the apparatus 100 may calculate the influence value for each interval $\Delta t$ for which differences have been calculated by the difference calculator 14. In a case where differences have been calculated for each of m waveforms $f^{j=1}$, $f^2$, $f^3$, $f^4$, ... $f^m$ for n intervals $\Delta t_{i=1}$, $\Delta t_2$, $\Delta t_3$, $\Delta t_4$, $\Delta t_5$, $\Delta t_6$, ... $\Delta t_n$, the influence value calculator 142 may calculate the coefficient $w_i$ and constant b from the expression $y_{out}^j = \Sigma_{i=1}^n w_i d(f_i^j - \hat{f}_i) + b$, where $d(f_i^j - \hat{f}_i)$ represents the difference between the j-th waveform $f^j$ and the standard waveform $\hat{f}$ over the i-th interval $\Delta t_i$ and $y_{out}^j$ is the j-th performance result, which corresponds to the j-th waveform $f^j$. The coefficient $w_i$ is an example of the influence value for the interval $\Delta t_i$. The difference $d(f_i^j - \hat{f}_i)$ may take various forms as described above, including the area between the j-th waveform $f^j$ and the standard waveform $\hat{f}$ over the i-th interval $\Delta t_i$ or the difference between the slope of the j-th waveform $f^j$ and the slope of the standard waveform $\hat{f}$ at the beginning or end of the i-th interval $\Delta t_i$.

Calculating the coefficients $w_i$ and constant b can be done, for example, by solving the expression $y_{out}^j = \Sigma_{i=1}^n w_i d(f_i^j - \hat{f}_i) + b$ as a system of m linear equations having n+1 variables ($w_1$, $w_2$, ... $w_n$, and b). For example, assuming m is greater than n+1, a least squares approximation method or other known computational method, such as quadratic programming or steepest descent method, can be used to find "best fit" approximate solutions for the dataset.

FIG. 3 shows example contents of the learning data storage 101 from which the data input section 110 may obtain the learning data in step S210 of the operational flow of FIG. 2. The learning data storage 101 shown in FIG. 3 stores learning data including m waveforms $f^{j=1}$, $f^2$, $f^3$, $f^4$, ... $f^m$ and m corresponding performance results $y_{out}^{j=1}$, $y_{out}^2$, $y_{out}^3$, $y_{out}^4$, ... $y_{out}^m$ in table form such that each of the waveforms f corresponds to the performance result $y_{out}$ having the same index j.

Figure 4:
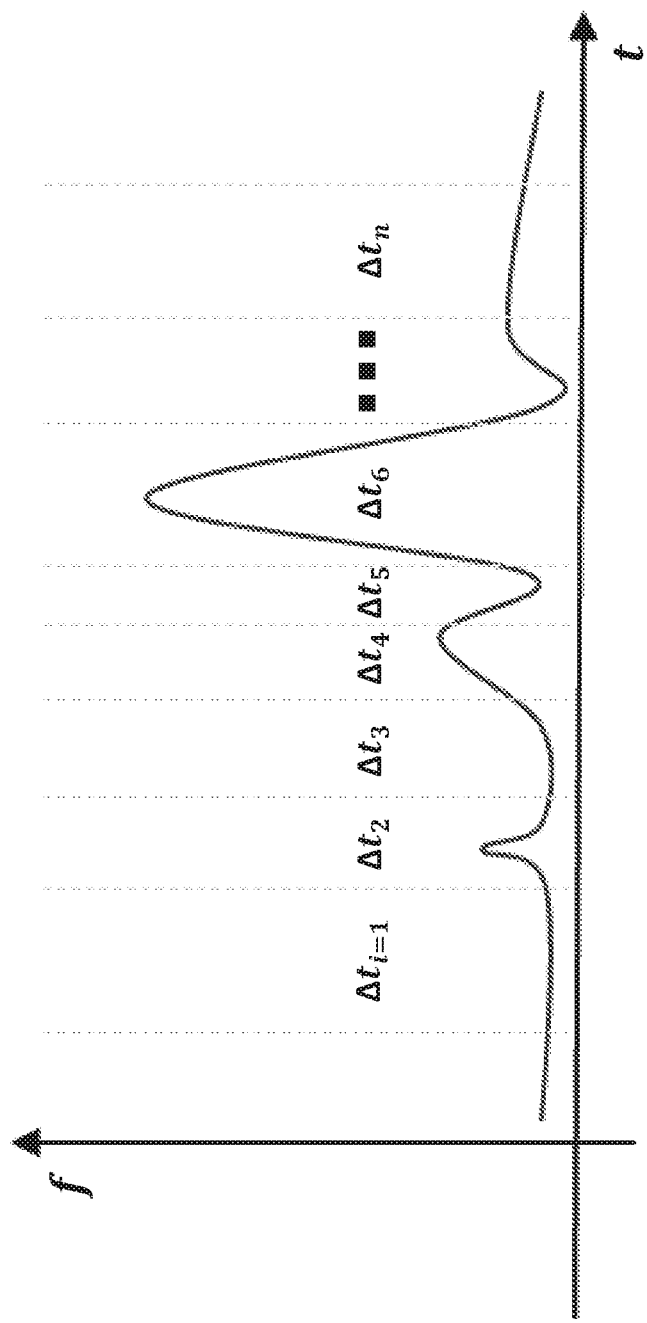
FIG. 4 illustrates an example of the intervals that may be used in step S230 of the operational flow of FIG. 2.

FIG. 4 shows an example waveform of the form f (t), which has been divided into n intervals $\Delta t_{i=1}$, $\Delta t_2$, $\Delta t_3$, $\Delta t_4$, $\Delta t_5$, $\Delta t_6$, ... $\Delta t_n$. The horizontal axis may, for example, represent time or crank angle and the vertical axis may represent heat release rate. The dividing section 130 may divide the waveform f into the intervals Δt as shown in FIG. 4. That is, the intervals Δt shown in FIG. 4 are an example of the intervals that may be calculated or determined by the dividing section 130 in step S230 of the operational flow of FIG. 2. As shown in FIG. 4, the intervals Δt may be irregular. For example, $\Delta t_6$ is wider than $\Delta t_5$.

Figure 5A:
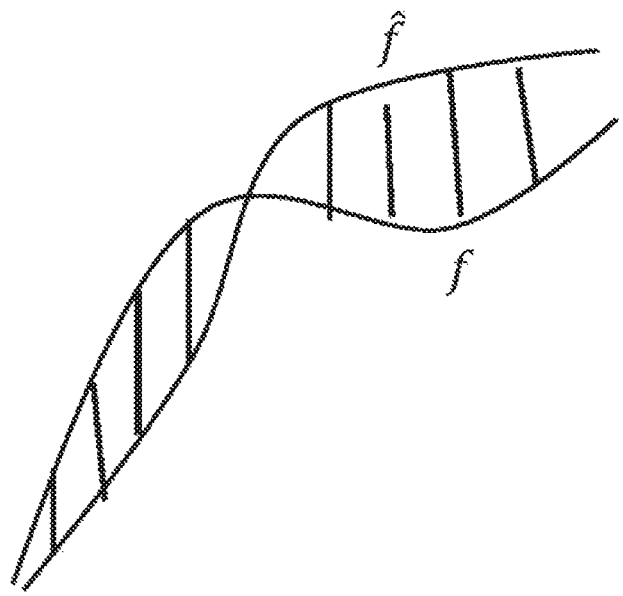
FIGS. 5A and 5B illustrate first and second examples of step S240 of the operational flow of FIG. 2.
Figure 5B:
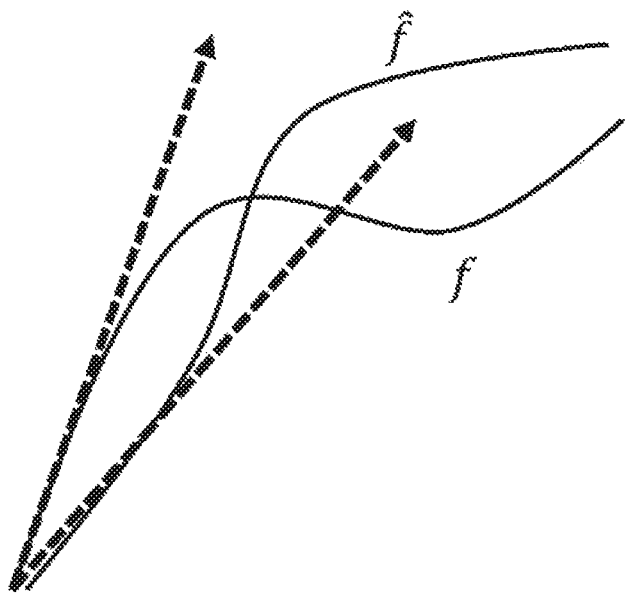

FIGS. 5A and 5B show a waveform f over one interval $\Delta t_i$ along with the standard waveform $\hat{f}$ over the same interval $\Delta t_i$. FIG. 5A illustrates a first example of step S240 of the operational flow of FIG. 2, in which the difference calculator 141 calculates, as the difference between the waveform f and the standard waveform $\hat{f}$ over the interval $\Delta t_i$, the area between the waveform f and the standard waveform $\hat{f}$ over the interval $\Delta t_i$. The hatch marks in FIG. 5A demarcate a shaded area representing the difference (positive and negative portions), which can be calculated, for example, by subtraction of the $\Delta t_i$-bounded integral of the standard waveform $\hat{f}$ from the $\Delta t_i$-bounded integral of the waveform f. Equivalently, the difference can be calculated by taking the $\Delta t_i$-bounded integral of $f-\hat{f}$. Alternatively, the difference can be calculated by taking the $\Delta t_i$-bounded integral of $|f-\hat{f}|$. FIG. 5B illustrates a second example of step S240 of the operational flow of FIG. 2, in which the difference calculator 141 calculates, as the difference between the waveform f and the standard waveform $\hat{f}$ over the interval $\Delta t_i$, the difference between the slope of the waveform f and the slope of the standard waveform $\hat{f}$ at any predetermined point such as the beginning or end of the interval $\Delta t_i$ or a difference between the average slopes of f and $\hat{f}$. The dashed arrows in FIG. 5B indicate the respective slopes of f and $\hat{f}$ at the beginning of the interval $\Delta t_i$. These slopes, or the slopes at the end of the interval $\Delta t_i$ or other predetermined point can be calculated, for example, by taking the derivatives of f and $\hat{f}$. The difference between the slopes can be calculated based on an inner product of unit vectors of the slopes. Regardless of the method used to arrive at the difference, the difference is represented by $d(f_i^j - \hat{f}_i)$ as described above.

Figure 6:
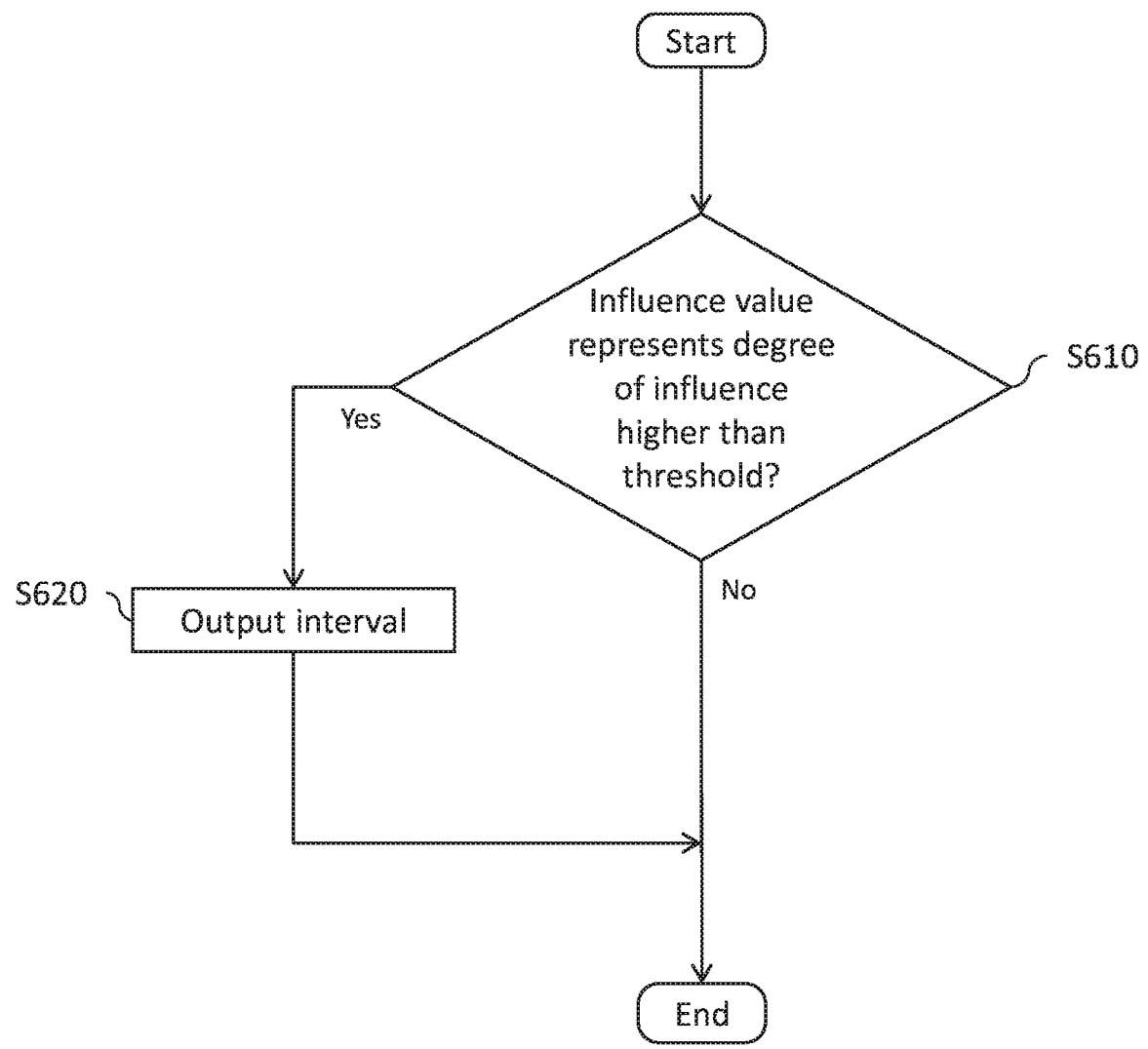
FIG. 6 shows a first example output process of the apparatus 100, which may occur after the operational flow of FIG. 2.

FIG. 6 shows a first example output process of the apparatus 100, which may occur after the operational flow of FIG. 2. After an influence value has been calculated for each of the interval(s) in step S250 of FIG. 2, it is determined, for each of the calculated influence value(s), whether the influence value represents a degree of influence higher than a threshold (S610). For any influence value that represents a degree of influence higher than the threshold, the corresponding interval is output (S620). For example, if the influence value(s) themselves indicate the degree of influence, the influence determining section 160 of the apparatus 100 may compare each of the influence value(s) directly to a threshold stored in the threshold storage 150. For any influence value that exceeds the threshold, the output section 190 outputs the corresponding interval.

Alternatively, the influence value(s) may indirectly represent a degree of influence. For example, in a case where an influence value and its negative represent the same degree of influence, it may first be necessary to take the absolute value of an influence value before comparison with a threshold. As another example, a degree of influence may correspond to a range of influence values. In cases such as these, the influence determining section 160 of the apparatus 100 may compare a value derived from each of the influence value(s) to a threshold stored in the threshold storage 150. For any influence value whose derived degree of influence exceeds the threshold, the output section 190 outputs the corresponding interval.

The degree of influence refers to the influence that a given interval Δt of the plurality of waveforms has on the performance results. If the degree of influence is higher over a first interval than a second, the physical characteristic represented by the waveforms (e.g. heat release rate) is expected to have a more significant effect on the performance results (e.g. engine noise at the frequency of interest) during the first interval than the second. Since the calculated influence values, e.g. coefficients w, represent the degrees of influence over the intervals Δt, they contain information about the significance of each interval with respect to the performance results. If a high threshold is set in the threshold storage 150, the influence determining section 160 allows the user of the apparatus 100 to focus on only the most significant intervals. On the other hand, if a low threshold (e.g. no threshold) is set in the threshold storage 150, intervals can be output by the output section 190 irrespective of their significance. The output section 190 may also output the influence value(s) themselves, not only the intervals, via the influence determining section 160. Thus, setting a low threshold (e.g. no threshold) can be a way of obtaining raw data of the calculating section 140. Alternatively, while not depicted in FIG. 1, the output section 190 may refer directly to the output of the calculating section 140 when outputting all interval(s) and/or influence value(s) without the use of a threshold.

Figure 7:
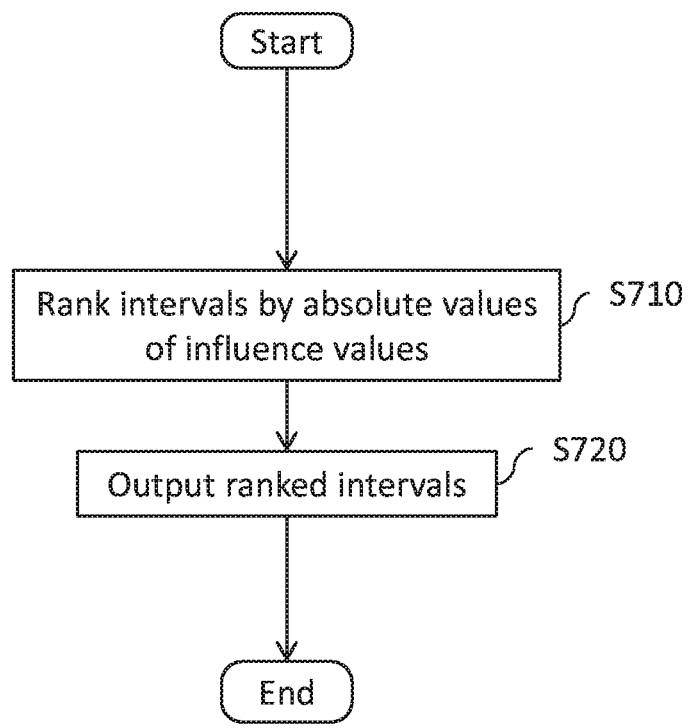
FIG. 7 shows a second example output process of the apparatus 100, which may occur after the operational flow of FIG. 2.

FIG. 7 shows a second example output process of the apparatus 100, which may occur after the operational flow of FIG. 2. After an influence value has been calculated for each of at least two intervals in step S250 of FIG. 2, the intervals are ranked by the absolute values of the influence values (S710). The ranked intervals are then output (S720). For example, after the calculating section 140 of the apparatus 100 calculates the influence value for each of at least two intervals, the ranking section 170 may rank the intervals corresponding to the calculated influence values by the absolute values of the influence values. Alternatively, the ranking section 170 may rank the intervals by the influence values without taking the absolute values. The output section 190 may output the ranked intervals, for example, in the form of an ordered list or as a bar graph depicting the value of the influence values for each interval.

Figure 8:
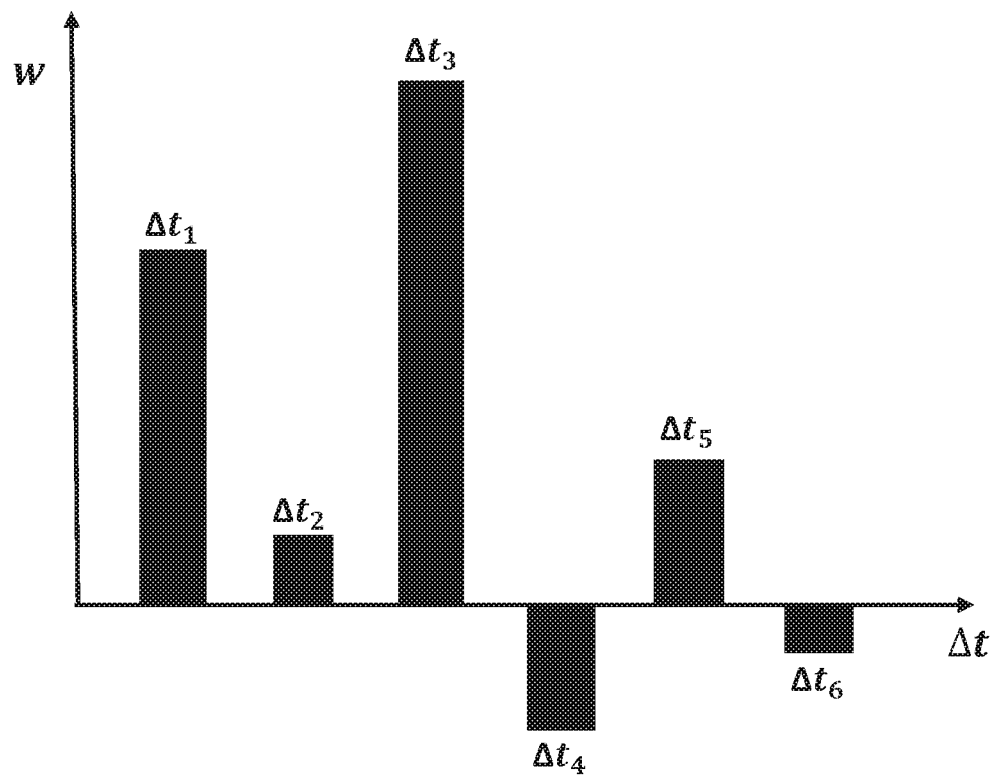
FIG. 8 shows an example output of the operational flow of FIG. 7.

FIG. 8 is an example output of the operational flow of FIG. 7 in the form of a bar graph depicting the value of the coefficient w for each of six intervals $\Delta t_1$-$\Delta t_6$, the coefficient w being an example of the influence value. In the example of FIG. 8, the ranking section 170 has ranked the intervals by the coefficients without taking the absolute values, so some of the coefficients ($\Delta t_4$ and $\Delta t_6$) are negative. In the case of a bar graph such as the bar graph shown in FIG. 8, the intervals are "ranked" in the sense that the intervals are visually arranged by the value of the coefficient, i.e. from top to bottom beginning with $\Delta t_3$ and ending with $\Delta t_4$. A bar graph such as the bar graph shown in FIG. 8 provides the advantage over an ordered list in that the relative influence values between each interval can be visually understood at a glance. For example, assuming the influence values themselves indicate the degree of influence, a user of the apparatus 100 may quickly recognize that $\Delta t_3$ and $\Delta t_1$ should be the focus of further investigation, while observing that the influences of $\Delta t_2$, $\Delta t_4$, $\Delta t_5$, and $\Delta t_6$ are clumped together at a lower level. While an ordered list may provide the same information after a detailed study, it is not as easy to determine a cutoff point at a glance.

Figure 9:
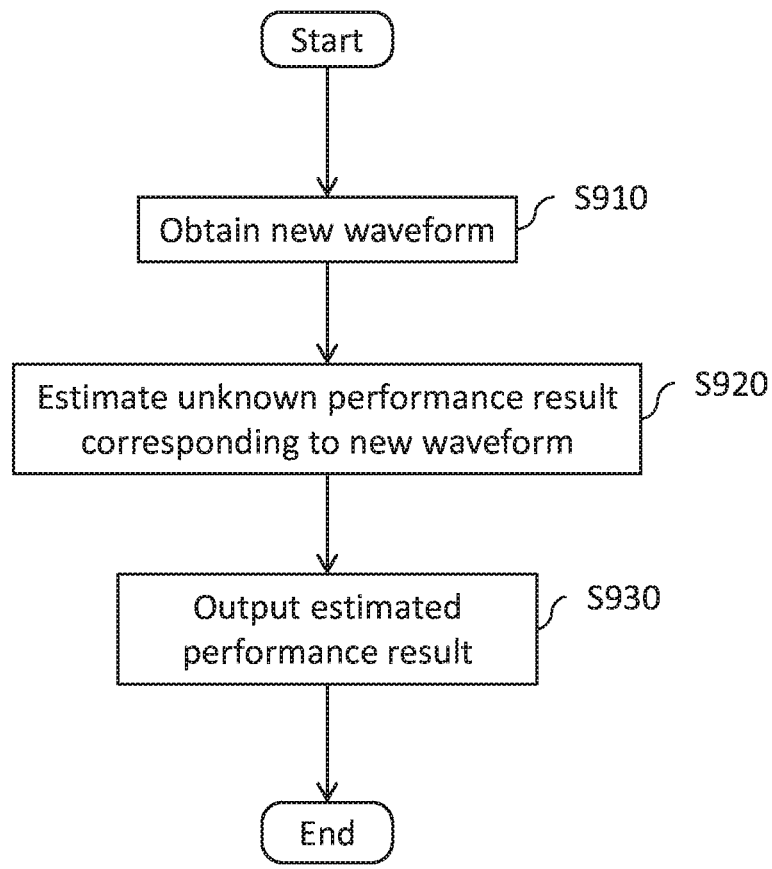
FIG. 9 shows a third example output process of the apparatus 100, which may occur after the operational flow of FIG. 2.

FIG. 9 shows a third example output process of the apparatus 100, which may occur after the operational flow of FIG. 2. After an influence value has been calculated for each of the interval(s) in step S250 of FIG. 2, the expression $y_{out}^j = \sum_{i=1}^n w_i d(f_i^j - \hat{f}_i) + b$ can be modified to remove the index j and the resulting expression, $y_{out} = \sum_{i=1}^n w_i d(f_i - \hat{f}_i) + b$ can be used as a predictive function for unknown $y_{out}$ given a new hypothetical waveform f. In this way, a user can run a simulation of the machine to determine the expected performance results associated with a hypothetical waveform. First, a new waveform is obtained (S910). For example, the data input section 110 of the apparatus 100 may obtain, from a user, a new waveform (e.g. modified learning data or waveform created from scratch) representing a hypothetical measurement of the physical characteristic of the machine's operation. Then, an unknown performance result corresponding to the new waveform is estimated (S920). For example, the estimating section 180 may estimate the unknown performance result $y_{out}$ using the expression $y_{out} = \sum_{i=1}^n w_i d(f_i - \hat{f}_i) + b$ by plugging in the values for $w_i$ and b calculated by the calculating section 140 and reusing the same standard waveform $\hat{f}$ that was generated by the standard waveform generating section 120. The estimated performance result $y_{out}$ is then output (S930), for example, by the output section 190.

As can be understood from this disclosure, given a dataset of waveforms representing measurements of a physical characteristic of a machine and associated performance results, the features of the apparatus 100 can be used to determine correlations between isolated features of the waveforms and the performance results in the form of influence values calculated for each of a plurality of intervals. On the basis of these influence values, the apparatus 100 can provide a user with valuable information about the correlations and predict unknown performance results of hypothetical waveforms. Since the apparatus 100 automates the isolation and selection of relevant features of the waveforms, the burden of performing accurate analysis on large datasets is lessened.

Figure 10:
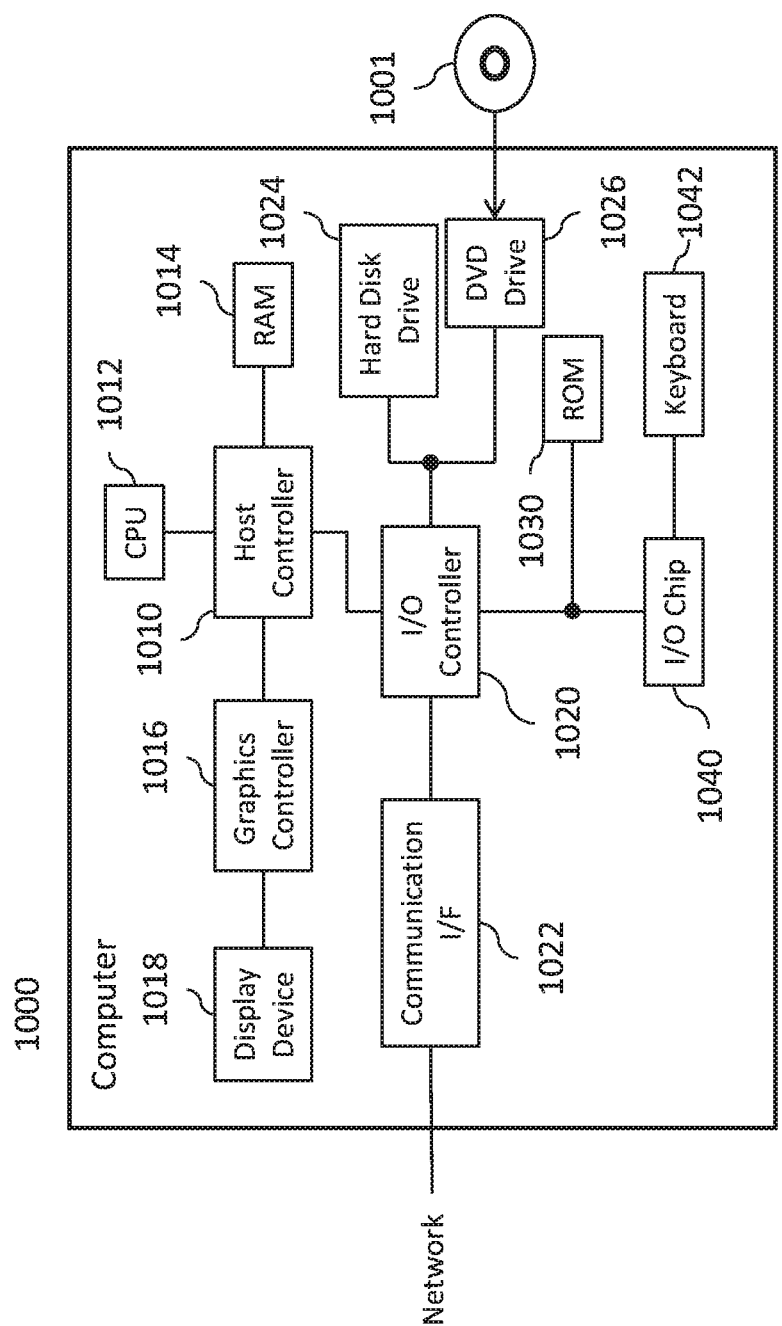
FIG. 10 shows an example of a computer 1000 in which the apparatus 100, the operational flow of FIG. 2, the operational flows of FIGS. 6, 7, and 9, and/or other embodiments of the claimed invention may be wholly or partly embodied.

FIG. 10 shows an example of a computer 1000 in which the apparatus 100, the operational flow of FIG. 2, the operational flows of FIGS. 6, 7, and 9, and/or other embodiments of the claimed invention may be wholly or partly embodied. The computer 1000 according to the present embodiment includes a CPU 1012, a RAM 1014, a graphics controller 1016, and a display device 1018, which are mutually connected by a host controller 1010. The computer 1000 also includes input/output units such as a communication interface 1022, a hard disk drive 1024, and a DVD-ROM drive 1026, which are connected to the host controller 1010 via an input/output controller 1020. The computer also includes legacy input/output units such as a ROM 1030 and a keyboard 1042, which is connected to the input/output controller 1020 through an input/output chip 1040.

The host controller 1010 connects the RAM 1014 with the CPU 1012 and the graphics controller 1016, which access the RAM 1014 at a high transfer rate. The CPU 1012 operates according to programs stored in the ROM 1030 and the RAM 1014, thereby controlling each unit. The graphics controller 1016 obtains image data generated by the CPU 1012 on a frame buffer or the like provided in the RAM 1014, and causes the image data to be displayed on the display device 1018. Alternatively, the graphics controller 1016 may contain therein a frame buffer or the like for storing image data generated by the CPU 1012.

The input/output controller 1020 connects the host controller 1010 with the communication interface 1022, the hard disk drive 1024, and the DVD-ROM drive 1026, which are relatively high-speed input/output units. The communication interface 1022 communicates with other electronic devices via a network. The hard disk drive 1024 stores programs and data used by the CPU 1012 within the computer 1000. The DVD-ROM drive 1026 reads the programs or the data from the DVD-ROM 1001, and provides the hard disk drive 1024 with the programs or the data via the RAM 1014.

The ROM 1030 and the keyboard 1042 and the input/output chip 1040, which are relatively low-speed input/output units, are connected to the input/output controller 1020. The ROM 1030 stores therein a boot program or the like executed by the computer 1000 at the time of activation, a program depending on the hardware of the computer 1000. The keyboard 1042 inputs text data or commands from a user, and may provide the hard disk drive 1024 with the text data or the commands via the RAM 1014. The input/output chip 1040 connects the keyboard 1042 to the input/output controller 1020, and may connect various input/output units via a parallel port, a serial port, a keyboard port, a mouse port, and the like to the input/output controller 1020.

A program to be stored on the hard disk drive 1024 via the RAM 1014 is provided by a recording medium such as the DVD-ROM 1001 or an IC card. The program is read from the recording medium, installed into the hard disk drive 1024 within the computer 1000 via the RAM 1014, and executed in the CPU 1012.

A program that is installed in the computer 1000 can cause the computer 1000 to function as an apparatus such as the apparatus 100 of FIG. 1. Such a program may act on the CPU 1012 to cause the computer 1000 to function as some or all of the sections, components, elements, databases, etc. of the apparatus 100 of FIG. 1 (e.g., the standard waveform generating section 120, the calculating section 140, etc.).

A program that is installed in the computer 1000 can also cause the computer 1000 to perform an operational flow such as the operational flow of FIG. 2, 6, 7, or 9. Such a program may act on the CPU 1012 to cause the computer 1000 to perform some or all of the steps of FIG. 2, 6, 7, or 9 (e.g., generate standard waveform S220, calculate influence values for each interval S250, etc.).

The information processing described in these programs is read into the computer 1300, resulting in the cooperation between a program and the above-mentioned various types of hardware resources. An apparatus or method may be constituted by realizing the operation or processing of information in accordance with the usage of the computer 1000.

For example, when communication is performed between the computer 1000 and an external device, the CPU 1012 may execute a communication program loaded onto the RAM 1014 to instruct communication processing to the communication interface 1022, based on the processing described in the communication program.

The communication interface 1022, under control of the CPU 1012, reads transmission data stored on a transmission buffering region provided in a recording medium such as the RAM 1014, the hard disk drive 1024, or the DVD-ROM 1001, and transmits the read transmission data to a network or writes reception data received from a network to a reception buffering region or the like provided on the recording medium. In this way, the communication interface 1022 may exchange transmission/reception data with a recording medium by a DMA (direct memory access) method or by a configuration in which the CPU 1012 reads the data from the recording medium or the communication interface 1022 of a transfer destination and writes the data into the communication interface 1022 or the recording medium of the transfer destination, so as to transfer the transmission/reception data.

In addition, the CPU 1012 may cause all or a necessary portion of a file or a database to be read into the RAM 1014 such as by DMA transfer, the file or the database having been stored in an external recording medium such as the hard disk drive 1024, the DVD-ROM drive 1026 (DVD-ROM 1001) and perform various types of processing on the data on the RAM 1014. The CPU 1012 may then write back the processed data to the external recording medium by means of a DMA transfer method or the like. In such processing, the RAM 1014 can be considered to temporarily store the contents of the external recording medium, and so the RAM 1014, the external recording apparatus, and the like are collectively referred to as a memory, a storage section, a recording medium, a computer readable medium, etc.

Various types of information, such as various types of programs, data, tables, and databases, may be stored in the recording apparatus to undergo information processing. Note that the CPU 1012 may also use a part of the RAM 1014 to perform reading/writing thereto on a cache memory. In such an embodiment, the cache is considered to be contained in the RAM 1014, the memory, and/or the recording medium unless noted otherwise, since the cache memory performs part of the function of the RAM 1014.

The CPU 1012 may perform various types of processing on the data read from the RAM 1014, which includes various types of operations, processing of information, condition judging, search/replace of information, etc., as described throughout this disclosure and designated by an instruction sequence of programs, and writes the result back to the RAM 1014. For example, when performing condition judging, the CPU 1012 may judge whether each type of variable is larger, smaller, no smaller than, no greater than, or equal to the other variable or constant, and when the condition judging results in the affirmative (or in the negative), the process branches to a different instruction sequence or calls a subroutine.

In addition, the CPU 1012 may search for information in a file, a database, etc., in the recording medium. For example, when a plurality of entries, each having an attribute value of a first attribute is associated with an attribute value of a second attribute, are stored in a recording apparatus, the CPU 1012 may search for an entry matching the condition whose attribute value of the first attribute is designated, from among the plurality of entries stored in the recording medium, and reads the attribute value of the second attribute stored in the entry, thereby obtaining the attribute value of the second attribute associated with the first attribute satisfying the predetermined condition.

The above-explained program or module may be stored in an external recording medium. Exemplary recording mediums include a DVD-ROM 1001, as well as an optical recording medium such as a Blu-ray Disk or a CD, a magneto-optic recording medium such as a MO, a tape medium, and a semiconductor memory such as an IC card. In addition, a recording medium such as a hard disk or a RAM provided in a server system connected to a dedicated communication network or the Internet can be used as a recording medium, thereby providing the program to the computer 1000 via the network.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server.

In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s).

In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An apparatus to permit improved performance of a machine based on one or more outputs generated during operation of the machine, comprising:
    a data input section operable to obtain a plurality of waveforms from a machine representing measurements of a physical characteristic of the machine's operation, and a plurality of performance results of the machine corresponding respectively to the plurality of waveforms, each of the plurality of performance results being indicative of the machine's performance under conditions at which the measurement represented by the corresponding waveform was made; and
    a calculating section operable to calculate, for each of at least one of a plurality of intervals associated with each of the plurality of waveforms, an influence value that represents a degree of influence of the plurality of waveforms on the plurality of performance results over the interval based on a difference between each of the plurality of waveforms and a standard waveform over the interval to permit the improved performance of the machine during operation of the machine.

2. The apparatus of claim 1, further comprising an influence determining section operable to determine whether the influence value calculated for each of the at least one of the plurality of intervals represents a degree of influence higher than a threshold.

3. The apparatus of claim 1, wherein the calculating section is further operable to calculate the influence value for each of at least two of the plurality of intervals.

4. The apparatus of claim 3, further comprising a ranking section operable to rank the at least two of the plurality of intervals by the absolute values of the influence values calculated for the at least two of the plurality of intervals.

5. The apparatus of claim 1, further comprising an estimating section operable to estimate, using the calculated influence values, an unknown performance result corresponding to a new waveform representing a hypothetical measurement of the physical characteristic of the machine's operation, the unknown performance result assumed to be indicative of the machine's performance under conditions at which the hypothetical measurement represented by the new waveform would be made.

6. The apparatus of claim 1, wherein the calculating section further includes:
    a difference calculator operable to calculate, for each of the at least one of the plurality of intervals, the difference between each of the plurality of waveforms and the standard waveform over the interval; and
    an influence value calculator operable to calculate the influence value for each of the at least one of the plurality of intervals from the differences calculated for the interval and the corresponding performance results.

7. The apparatus of claim 1, wherein the difference between each of the waveforms and the standard waveform over the interval is calculated as the area between the waveform and the standard waveform over the interval.

8. The apparatus of claim 1, wherein the difference between each of the plurality of waveforms and the standard waveform over the interval is calculated as a difference between a slope of each waveform and a slope of the standard waveform at the beginning or end of the interval.

9. The apparatus of claim 1, further comprising a standard waveform generating section operable to generate the standard waveform based on the plurality of waveforms.

10. The apparatus of claim 9, wherein the standard waveform generating section is operable to generate the standard waveform by averaging the plurality of waveforms.

11. The apparatus of claim 9, wherein the standard waveform generating section is operable to select, as the standard waveform, a waveform whose difference with respect to other ones of the plurality of waveforms is smallest among the plurality of waveforms.

12. The apparatus of claim 9, wherein the standard waveform generating section is operable to select, for each of the plurality of intervals, a waveform whose difference with respect to other ones of the plurality of waveforms is smallest over the interval among the plurality of waveforms and generate the standard waveform by combining the selected waveforms.

13. The apparatus of claim 1, wherein the intervals of the plurality of intervals are irregular.

14. The apparatus of claim 1, further comprising a dividing section operable to:
   divide each of the plurality of waveforms into the plurality of intervals; and
   approximate the standard waveform with a plurality of line segments and divide each of the plurality of waveforms using, as the plurality of intervals, intervals between endpoints of the line segments.

15. The apparatus of claim 1, wherein the machine is a combustion engine and the physical characteristic of the machine's operation is a heat release rate of the engine.

16. The apparatus of claim 15, wherein each of the waveforms represents a measurement of the heat release rate of the engine during a different engine cycle.

17. The apparatus of claim 16, wherein the waveforms are of the form heat release rate vs. time or heat release rate vs. crank angle of a crankshaft of the engine.

18. The apparatus of claim 15, wherein the performance results represent noise of the engine.

19. A method for permitting improved performance of a machine based on one or more outputs generated during operation of the machine comprising:
   obtaining a plurality of waveforms from a machine representing measurements of a physical characteristic of the machine's operation, and a plurality of performance results of the machine corresponding respectively to the plurality of waveforms, each of the plurality of performance results indicative of the machine's performance under conditions at which the measurement represented by the corresponding waveform was made;
   calculating, for each of at least one of a plurality of intervals associated with each of the plurality of waveforms, an influence value that represents a degree of influence of the plurality of waveforms on the plurality of performance results over the interval based on a difference between each of the plurality of waveforms and a standard waveform over the interval to permit the improved performance of the machine during operation of the machine.

20. A computer program product including a non-transitory computer readable storage medium having program instructions stored therein, the program instructions executable by a computer to cause the computer to perform operations for permitting improved performance of a machine based on one or more outputs generated during operation of the machine, the operation comprising:
   obtaining a plurality of waveforms from a machine representing measurements of a physical characteristic of the machine's operation, and a plurality of performance results of the machine corresponding respectively to the plurality of waveforms, each of the plurality of performance results indicative of the machine's performance under conditions at which the measurement represented by the corresponding waveform was made;
   calculating, for each of at least one of a plurality of intervals associated with each of the plurality of waveforms, an influence value that represents a degree of influence of the plurality of waveforms on the plurality of performance results over the interval based on a difference between each of the plurality of waveforms and a standard waveform over the interval to permit the improved performance of the machine during operation of the machine.

* * * * *